US010858735B2

(12) United States Patent
Wang et al.

(10) Patent No.: US 10,858,735 B2
(45) Date of Patent: *Dec. 8, 2020

(54) ALIGNMENT SYSTEMS EMPLOYING ACTUATORS PROVIDING RELATIVE DISPLACEMENT BETWEEN LID ASSEMBLIES OF PROCESS CHAMBERS AND SUBSTRATES, AND RELATED METHODS

(71) Applicant: Applied Materials, Inc., Santa Clara, CA (US)

(72) Inventors: Danny D. Wang, San Jose, CA (US); Jason Michael Lamb, Sunnyvale, CA (US); Jun Tae Choi, Cupertino, CA (US); Rupankar Choudhury, Karnataka (IN); Zhong Qiang Hua, Saratoga, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/561,329

(22) Filed: Sep. 5, 2019

(65) Prior Publication Data

US 2019/0390334 A1 Dec. 26, 2019

Related U.S. Application Data

(62) Division of application No. 14/522,350, filed on Oct. 23, 2014, now Pat. No. 10,435,786.

(60) Provisional application No. 62/048,755, filed on Sep. 10, 2014.

(51) Int. Cl.
*C23C 16/44* (2006.01)
*B01J 3/00* (2006.01)
(Continued)

(52) U.S. Cl.
CPC .......... *C23C 16/4409* (2013.01); *B01J 3/002* (2013.01); *B01J 3/006* (2013.01); *C23C 16/455* (2013.01); *C23C 16/507* (2013.01)

(58) Field of Classification Search
CPC . C23C 16/4409; C23C 16/507; C23C 16/455; B01J 3/006; B01J 3/002
See application file for complete search history.

(56) References Cited

U.S. PATENT DOCUMENTS 2,883,084 A * 4/1959 Shankland ............... F16J 13/20
220/324
4,475,122 A * 10/1984 Green ................... G03F 9/7088
348/87

(Continued)

FOREIGN PATENT DOCUMENTS

WO 2014149883 A1 9/2014

*Primary Examiner* — Kambiz Zand
*Assistant Examiner* — Mirza Israr Javed
(74) *Attorney, Agent, or Firm* — Patterson + Sheridan, LLP

(57) ABSTRACT

Alignment systems employing actuators provide relative displacement between lid assemblies of process chambers and substrates, and related methods are disclosed. A process chamber includes chamber walls defining a process volume in which a substrate may be placed and the walls support a lid assembly of the process chamber. The lid assembly contains at least one of an energy source and a process gas dispenser. Moreover, an alignment system may include at least one each of a bracket, an interface member, and an actuator. By attaching the bracket to the chamber wall and securing the interface member to the lid assembly, the actuator may communicate with the bracket and the interface member to provide relative displacement between the chamber wall and the lid assembly. In this manner, the lid assembly may be positioned relative to the substrate to improve process uniformity across the substrate within the process chamber.

18 Claims, 8 Drawing Sheets

(51) Int. Cl.
*C23C 16/455* (2006.01)
*C23C 16/507* (2006.01)

(56) References Cited

U.S. PATENT DOCUMENTS

| | | | | |
|---|---|---|---|---|
| 5,092,963 A * | 3/1992 | Barker | ............ | B01J 3/03 134/177 |
| 5,477,057 A * | 12/1995 | Angeley | ............ | G03F 9/7088 250/548 |
| 6,273,022 B1 | 8/2001 | Pu et al. | | |
| 6,776,848 B2 | 8/2004 | Rosenstein et al. | | |
| 7,535,193 B2 * | 5/2009 | Xu | ............ | G05B 19/404 310/311 |
| 2002/0117262 A1* | 8/2002 | Pang | ............ | C23C 16/44 156/345.1 |
| 2002/0121342 A1* | 9/2002 | Nguyen | ............ | C23C 16/452 156/345.33 |
| 2003/0010451 A1* | 1/2003 | Tzu | ............ | C23C 16/45512 156/345.33 |
| 2003/0131794 A1* | 7/2003 | Rosenstein | ............ | C23C 16/44 118/722 |
| 2004/0108068 A1* | 6/2004 | Senzaki | ............ | H01J 37/32458 156/345.43 |
| 2004/0251130 A1 | 12/2004 | Liu et al. | | |
| 2004/0257101 A1* | 12/2004 | Miura | ............ | H01L 21/681 324/750.18 |
| 2007/0028946 A1* | 2/2007 | Vogtmann | ............ | B08B 1/00 134/6 |
| 2008/0150559 A1* | 6/2008 | Nayak | ............ | G01R 31/2887 324/750.19 |
| 2008/0284455 A1* | 11/2008 | Obikane | ............ | G01R 31/2893 324/754.08 |
| 2009/0067976 A1* | 3/2009 | Xu | ............ | H01L 21/68 414/757 |
| 2009/0069797 A1 | 3/2009 | Xu | | |
| 2010/0054901 A1* | 3/2010 | Lin | ............ | H01L 21/681 414/590 |
| 2011/0298075 A1* | 12/2011 | Teramoto | ............ | G02B 7/021 257/432 |
| 2014/0208813 A1* | 7/2014 | Reeb | ............ | B65F 1/1646 70/277 |
| 2016/0068951 A1* | 3/2016 | Wang | ............ | B01J 3/006 118/723 R |

* cited by examiner

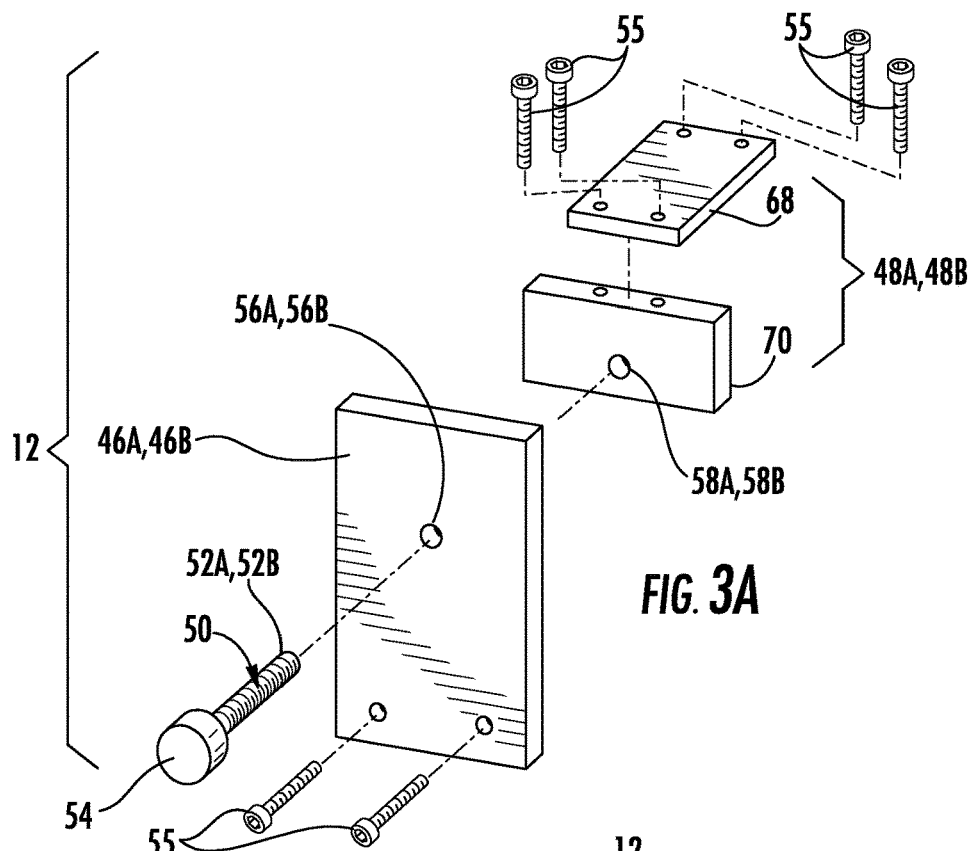
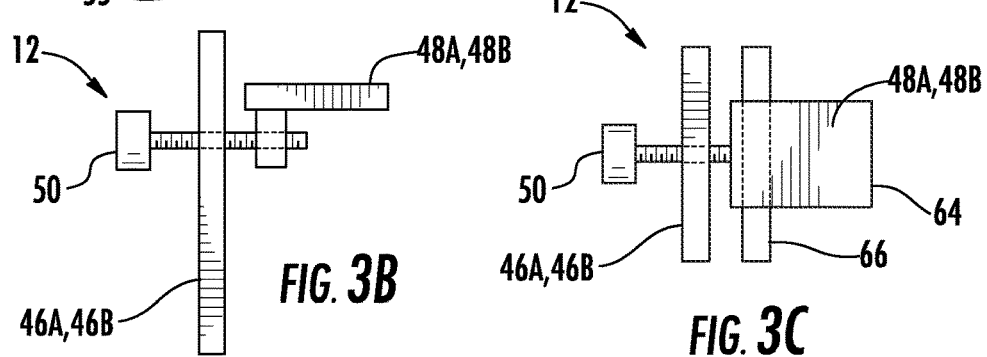
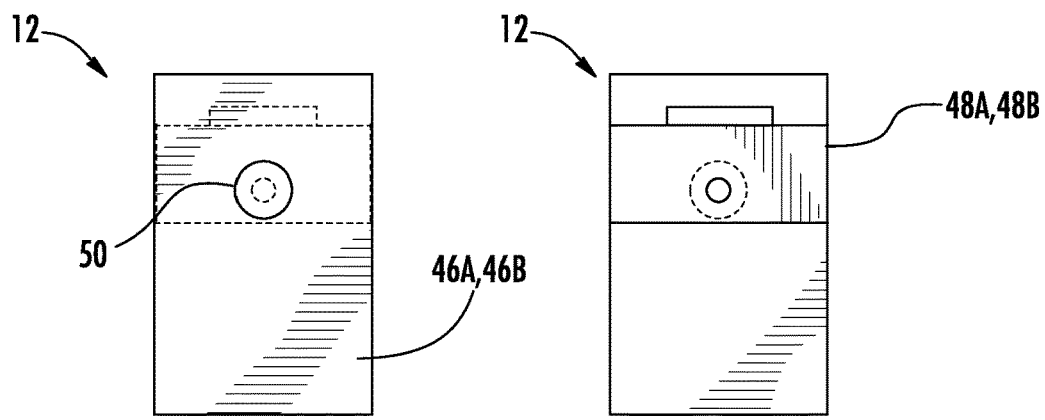
FIG. 3A
FIG. 3B
FIG. 3C
FIG. 3D
FIG. 3E

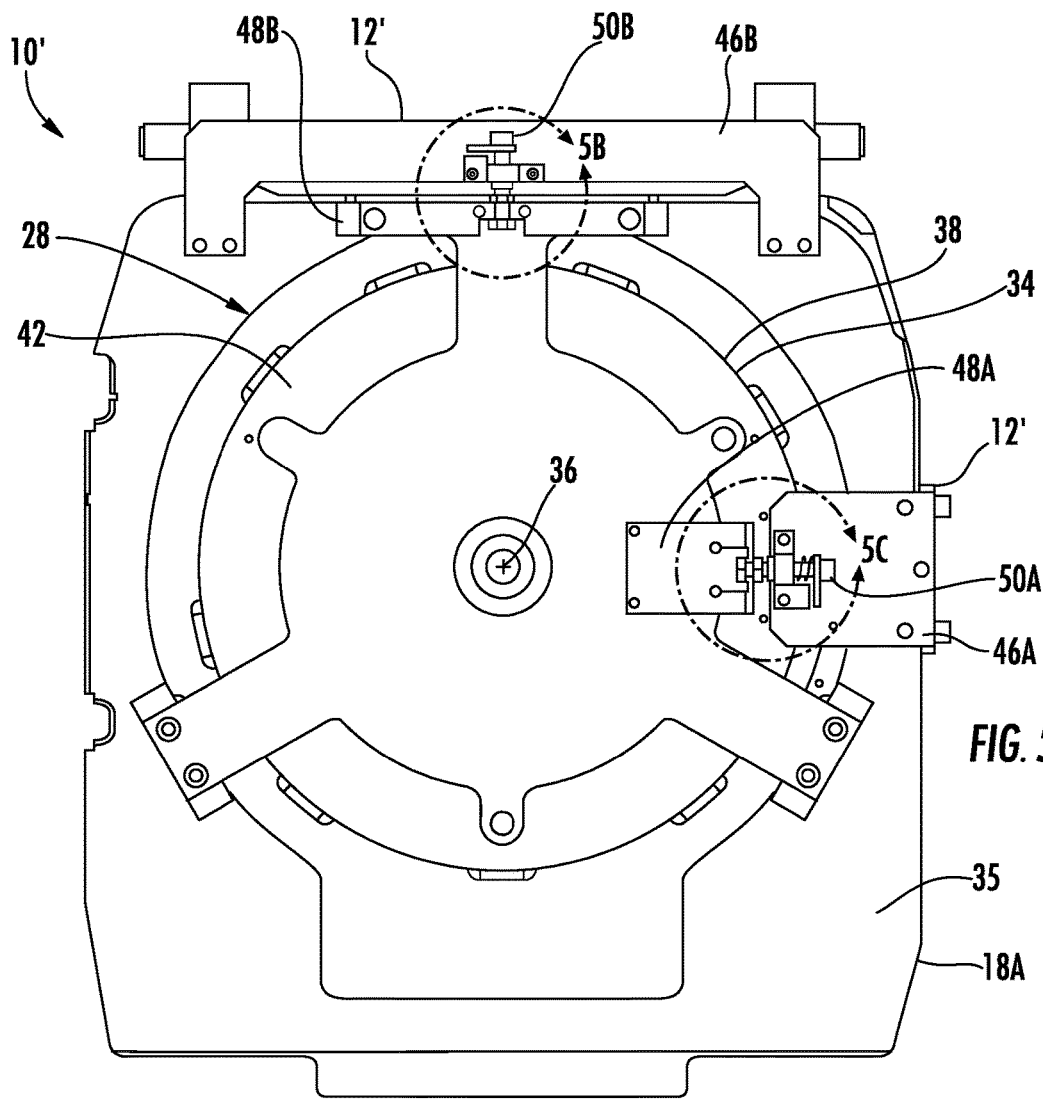
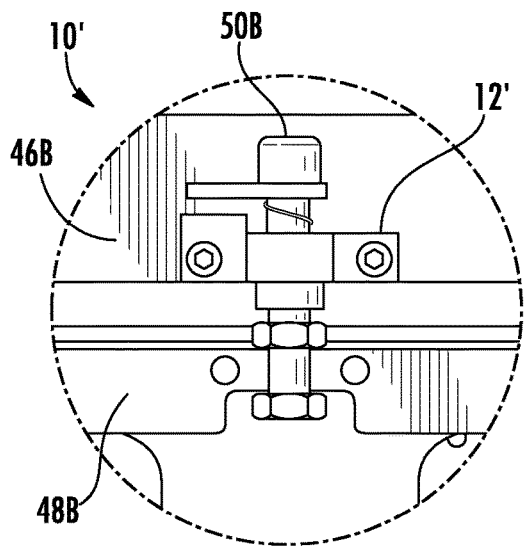
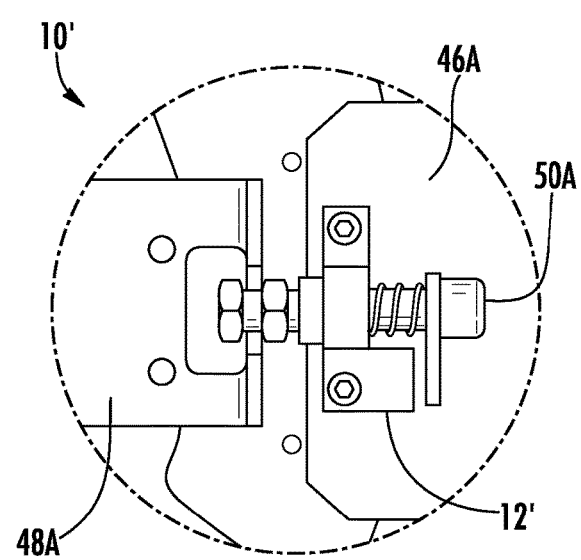
FIG. 5A
FIG. 5B
FIG. 5C

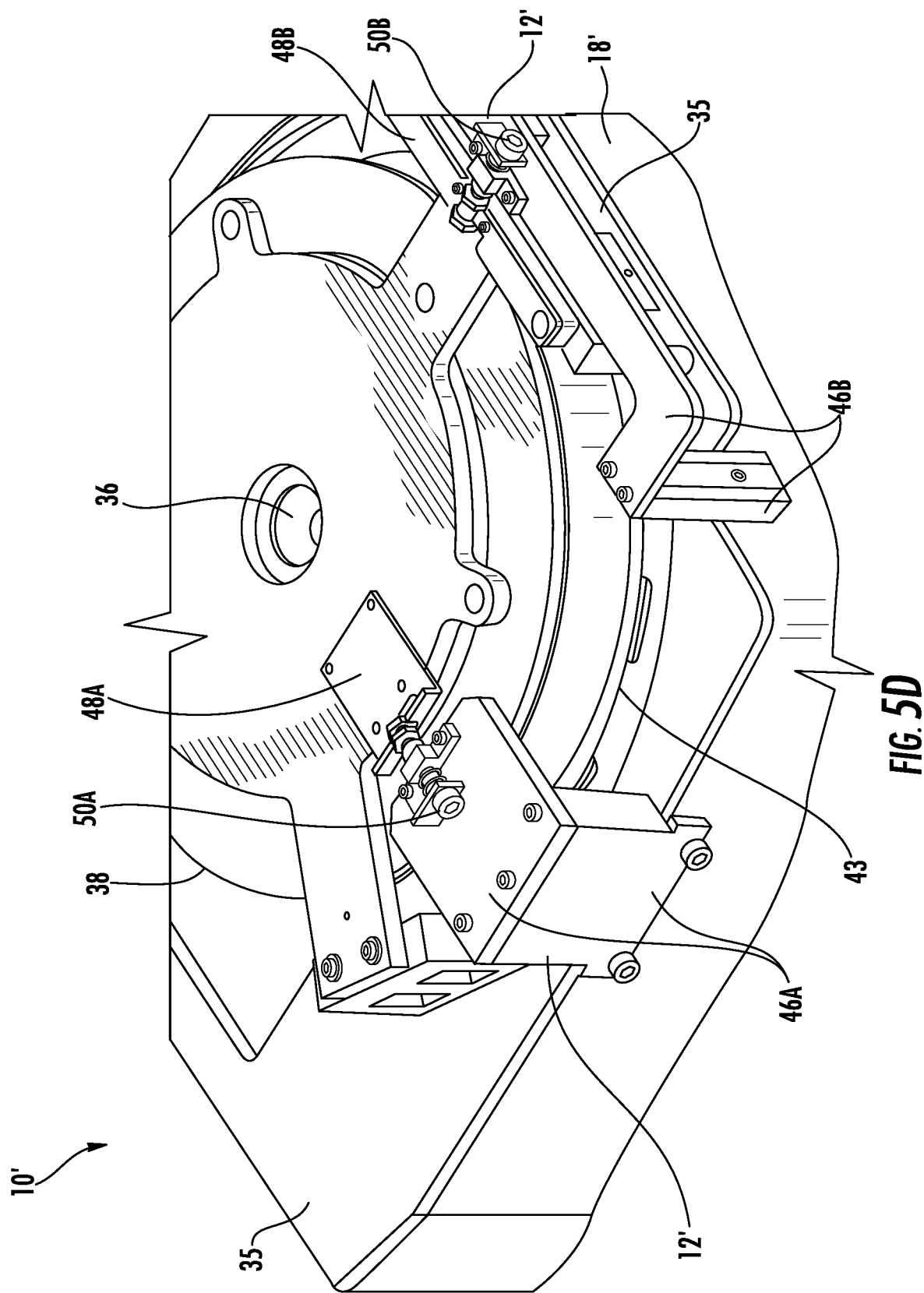

ALIGNMENT SYSTEMS EMPLOYING ACTUATORS PROVIDING RELATIVE DISPLACEMENT BETWEEN LID ASSEMBLIES OF PROCESS CHAMBERS AND SUBSTRATES, AND RELATED METHODS

CROSS-REFERENCE TO RELATED APPLICATION

This application is a divisional of U.S. patent application Ser. No. 14/522,350 filed on Oct. 23, 2014, which claims the benefit of U.S. Provisional Application Ser. No. 62/048,755 filed Sep. 10, 2014, which are both hereby incorporated herein by reference.

BACKGROUND

Field

Embodiments of the present invention generally relate to dimensional control of features formed on substrates, and in particular to plasma process chambers to add or remove microlithography layers from substrates.

Description of the Related Art

In the fabrication of integrated circuits and other electronic devices using a process called microlithography, multiple layers of conducting, semiconducting, and dielectric materials are deposited on or removed from a surface of a wafer substrate, such as a semiconductor substrate or glass substrate. In many cases, as the layers are sequentially deposited on and removed, the substrate is maintained in a carefully controlled environment called a process volume within a process chamber which is thereby protected from the ambient environment. The process chamber includes input and output ports to introduce process gases into the process volume at precise flow rates to react with the substrate. The process chamber may also include energy sources to react with the process gases to facilitate the production of plasma. In this manner, the process chamber may provide temperatures and pressures that facilitate the deposition and removal of these layers while introducing the process gases to chemically react with and/or bond with materials at the surface of the substrate.

In many cases, the precise distribution and control of the process volume is challenging to manage. For example, the flow rates of the process gases at the input and output ports can be difficult to control and performance results between different process chambers may differ due to slight manufacturing differences between process chambers. The unwanted result is sometimes a dimensional non-uniformity error and is measurable after a substrate has been exposed within the process chamber and is later processed. As the demand for higher performance electronic devices are required that have smaller and more precise dimensions, better control of uniformity error is needed to reduce defect rates and improve manufacturing throughput.

SUMMARY

Embodiments disclosed herein include alignment systems employing actuators to provide relative displacement between lid assemblies of process chambers and substrates, and related methods. A process chamber includes chamber walls defining a process volume in which a substrate may be placed and the walls support a lid assembly of the process chamber. The lid assembly contains at least one of an energy source and a process gas dispenser. Moreover, an alignment system may include at least one each of a bracket, an interface member, and an actuator. By attaching the bracket to the chamber wall and securing the interface member to the lid assembly, the actuator may communicate with the bracket and the interface member to provide relative displacement between the chamber wall and the lid assembly. In this manner, the lid assembly may be positioned relative to the substrate to improve process uniformity across the substrate within the process chamber.

In one embodiment, an alignment system for a lid assembly of a process chamber is disclosed. The alignment system includes at least one bracket attachable to the chamber wall of the process chamber. The alignment system includes at least one interface member securable to the lid assembly of the process chamber. The alignment system includes at least one actuator in communication with the at least one bracket and the at least one interface member. The at least one actuator is configured to provide relative displacement between the lid assembly and a substrate disposed within a process volume enclosed by the chamber wall. In this manner, the lid assembly may be positioned relative to a substrate within the chamber wall to improve uniformity performance across the substrate.

In another embodiment a method of aligning a lid assembly to a chamber wall of a process chamber is disclosed. The method includes attaching at least one bracket to the chamber wall. The method also includes securing at least one interface member to the lid assembly of the process chamber. The method also includes placing the at least one actuator in communication with the at least one bracket and the at least one interface. The method also includes providing, with the at least one actuator, relative displacement between the lid assembly and a substrate disposed within a process volume enclosed by the chamber wall based on a determined positional error. In this manner, a change in position may be determined for the substrate relative to the lid assembly to improve uniformity performance across the substrate.

In another embodiment, high-density plasma chemical vapor deposition (HDPCVD) chamber is disclosed. The HDPCVD chamber includes a chamber wall defining a process volume. The HDPCVD chamber also includes a substrate holder disposed at a predetermined position relative to the chamber wall. The HDPCVD chamber also includes a lid assembly comprising a dome and an energy delivery assembly. The HDPCVD chamber also includes at least one bracket attached to the chamber wall. The HDPCVD chamber also includes at least one interface member secured to the lid assembly. The HDPCVD chamber also includes at least one actuator in communication with the at least one bracket and the at least one interface member. The at least one actuator is configured to provide relative displacement between the lid assembly and a substrate at a predetermined location of the substrate holder to minimize uniformity error. In this manner, a uniform layer may be deposited upon a substrate positioned within the chamber wall.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A through 3E are a top exploded view, a right view, a top view, a front view, and a rear view, respectively, of exemplary components of the alignment system of FIG. 1A;

FIG. 5A is a top view of another embodiment of an exemplary process chamber and another embodiment of an exemplary alignment system, including a y-direction actuator and an x-direction actuator;

FIGS. 5B and 5C are close-up top views, respectively, of the y-direction actuator and the x-direction actuator of the alignment system of FIG. 5A; and FIG. 5D is a top perspective view of the process chamber and the alignment system of FIG. 5A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include alignment systems employing actuators providing relative displacement between lid assemblies of process chambers and substrates, and related methods. A process chamber includes chamber walls defining a process volume in which a substrate may be placed and the walls support a lid assembly of the process chamber. The lid assembly contains at least one of an energy source and a process gas dispenser. Moreover, an alignment system may include at least one each of a bracket, an interface member, and an actuator. By attaching the bracket to the chamber wall and securing the interface member to the lid assembly, the actuator may communicate with the bracket and the interface member to provide relative displacement between the chamber wall and the lid assembly. In this manner, the lid assembly may be positioned relative to the substrate to improve process uniformity across the substrate within the process chamber.

Figure 1A:
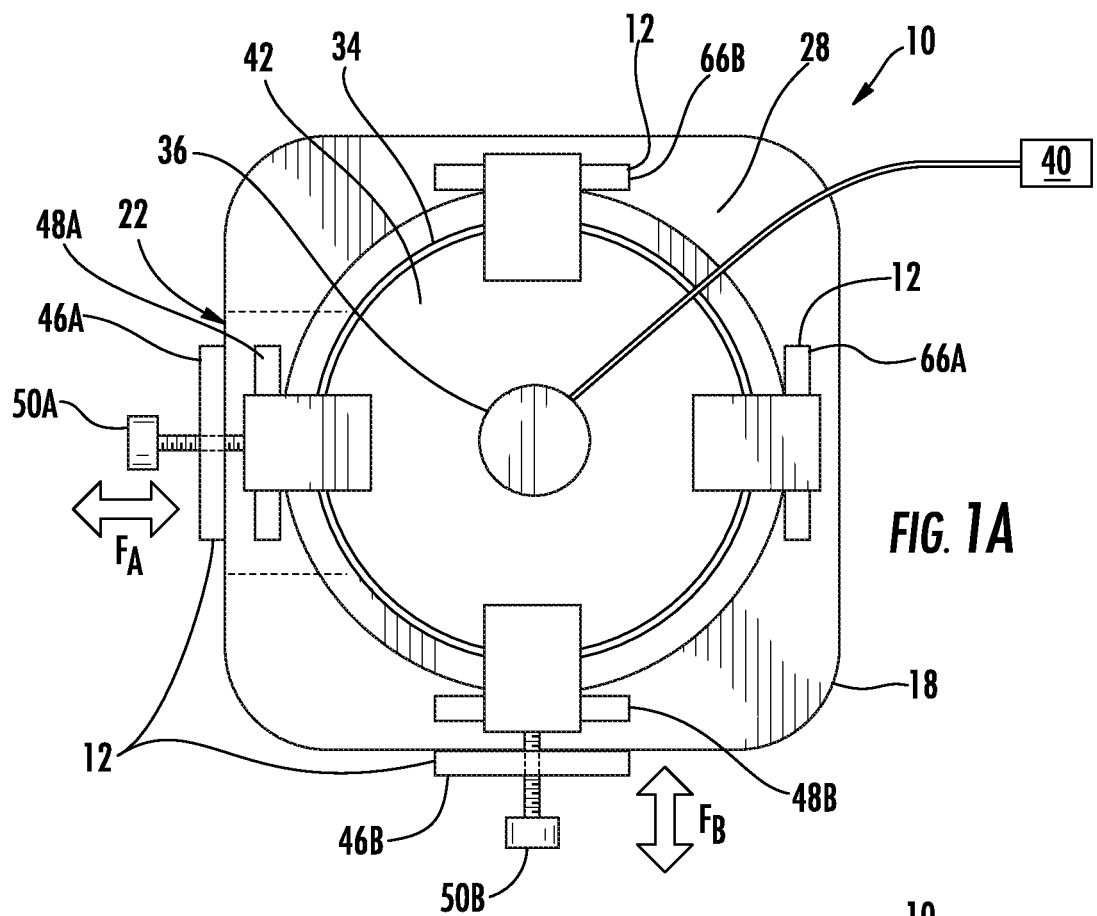
FIGS. 1A and 1B are a top view and a side view, respectively, of an exemplary process chamber with an exemplary alignment system coupled thereto.
Figure 1B:
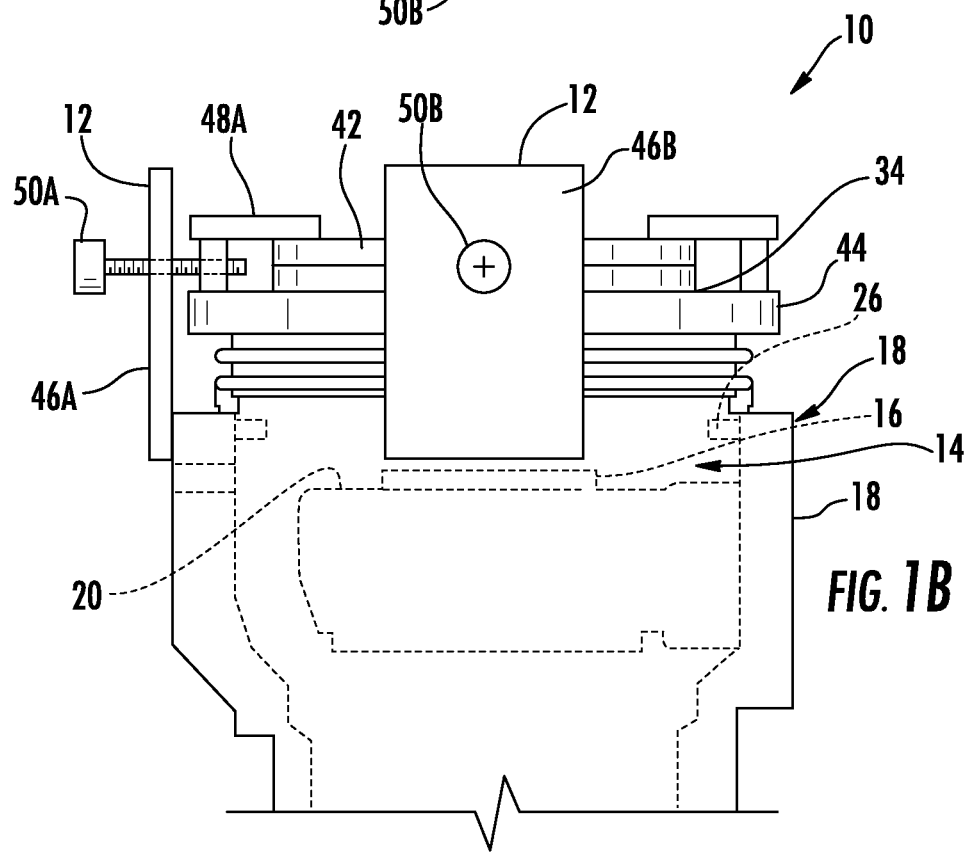
Figure 1C:
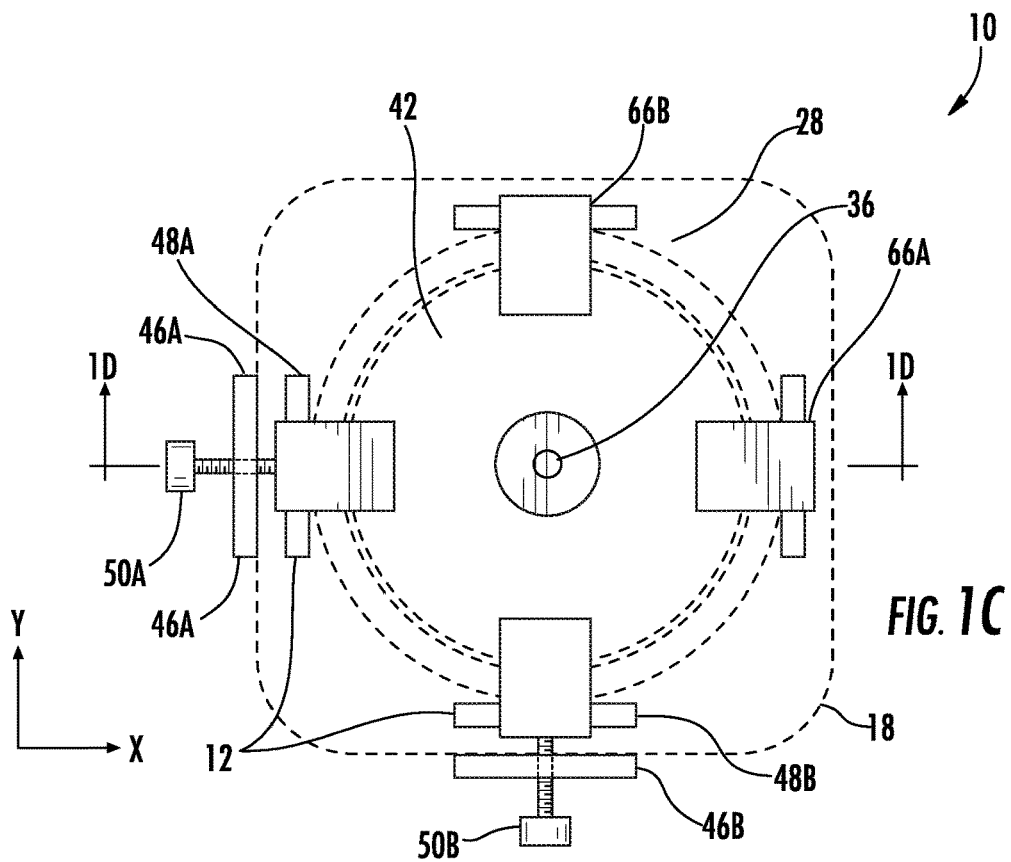
FIG. 1C is a top view of the process chamber of FIG. 1A and the alignment system coupled thereto, wherein the process chamber is depicted in phantom lines.
Figure 1D:
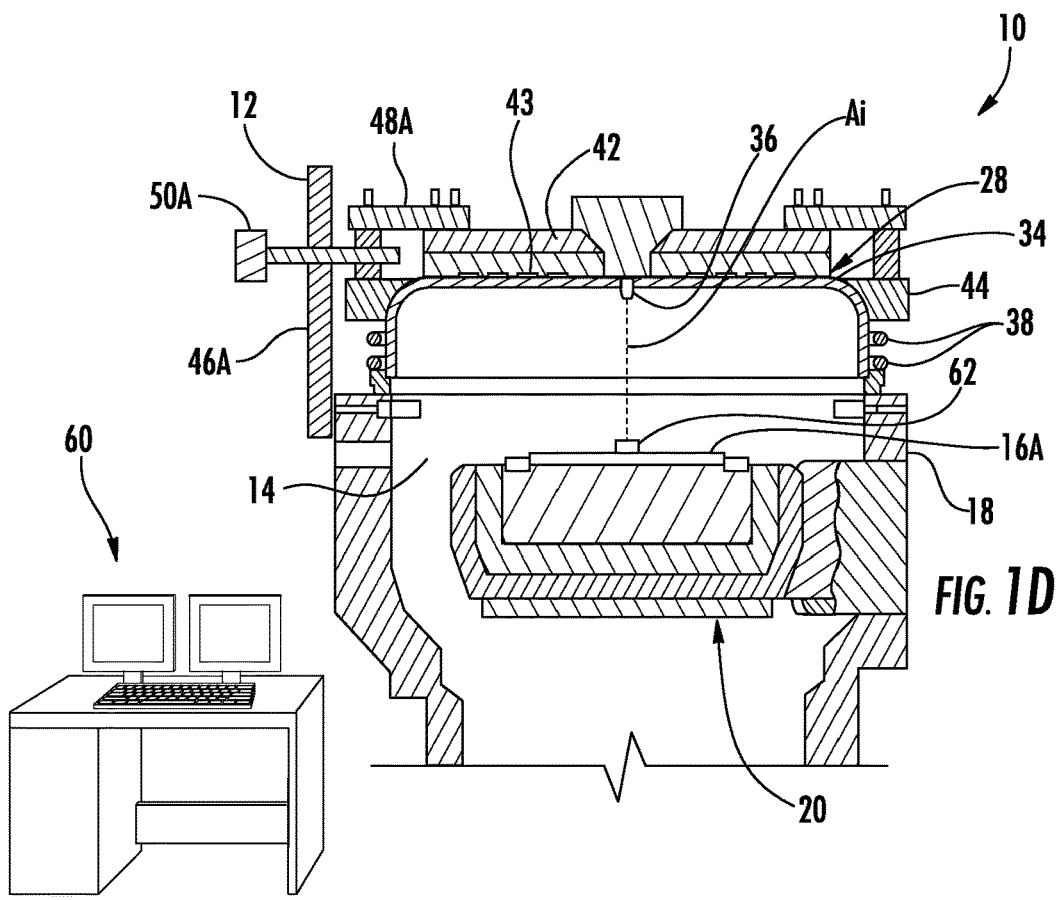
FIG. 1D is a front sectional view of the process chamber of FIG. 1A depicting an optional wafer camera and computer monitor system.
Figure 1E:
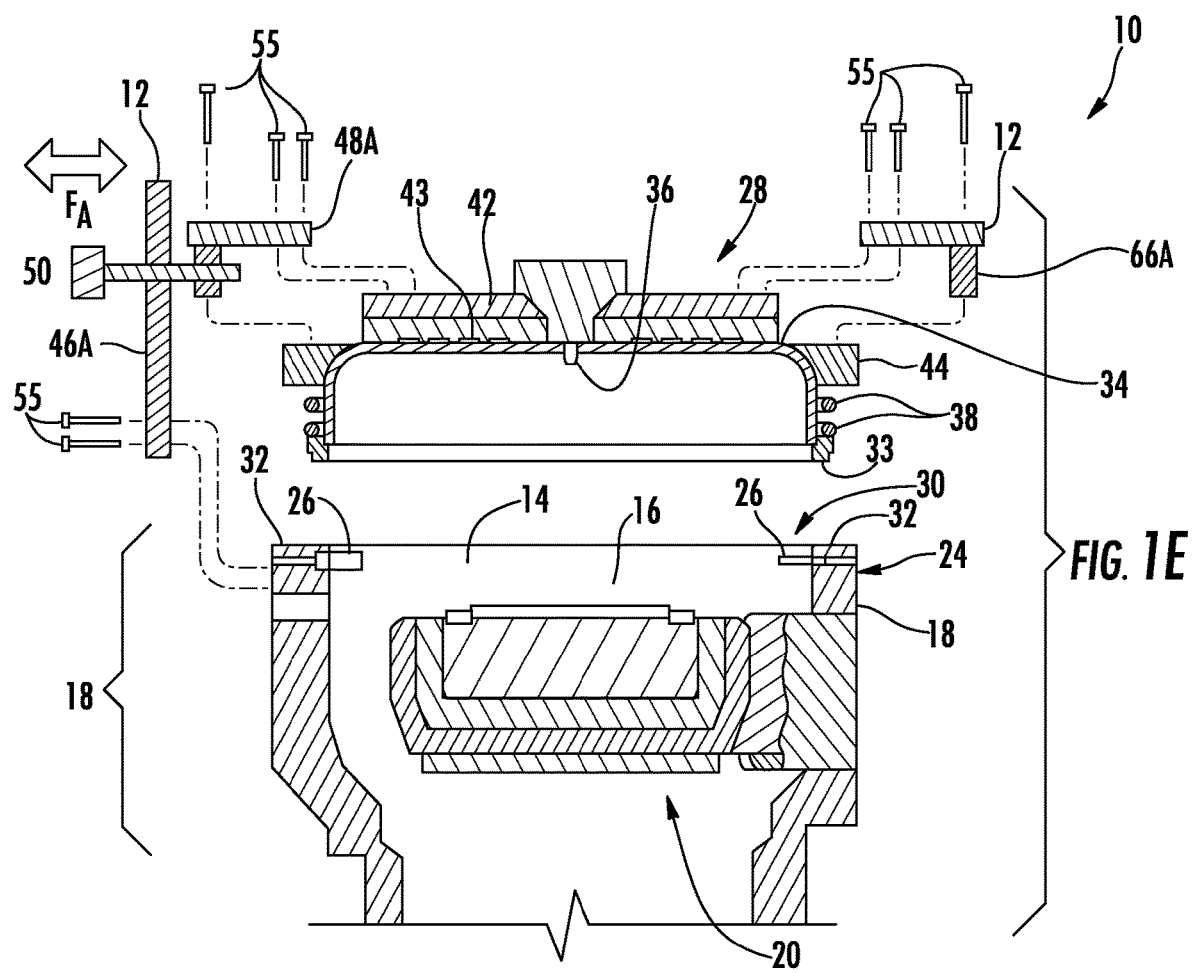
FIG. 1E is a front sectional exploded view of the process chamber of FIG. 1A.

In this regard, FIGS. 1A and 1B are a top view and a side view of an exemplary process chamber 10 with an exemplary alignment system 12 coupled thereto. In some examples, the process chamber 10 may be a high density plasma chemical vapor deposition (HDPCVD) chamber. In order to better visualize the alignment system 12 relative to the process chamber 10, FIGS. 1C through 1E are a top view, a front sectional view, and a front sectional exploded view, respectively, of the process chamber 10 of FIG. 1A and the alignment system 12 coupled thereto. The process chamber 10 is now discussed first.

The process chamber 10 is used to create a process volume 14 within which a substrate 16 may be exposed to process gases or plasma to add or remove topography from the substrate 16 in a process called microlithography. The substrate 16 may include, for example, a silicon wafer, quartz, or glass sheet. In some cases, the substrate 16 may be used to as part of a electronic component manufacturing process to make, for example, data processors, data memory chips, flat panel displays, and/or combinations thereof. The process chamber 10 includes many components to facilitate production the substrate 16.

One such component is the chamber wall 18. The chamber wall 18 is configured to define the process volume 14. Accordingly, the process volume 14 may be separated from the ambient environment to prevent contaminants from reaching the substrate 16 within of the process volume 14. In addition, the chamber wall 18 enabling precise control of the pressure and temperature of the process volume 14 as the substrate 16 is exposed to a predetermined make-up of process gases and/or plasma. The chamber wall 18 may comprise a strong, chemically resistive material, for example, stainless steel and/or aluminum. In this way, layers of material may be added or removed from the substrate 16 with minimal contamination.

The chamber wall 18 may also contain a pedestal 20 (or substrate holder) upon which the substrate 16 is supported during exposure to the process gas and/or plasma within the process volume 14. The pedestal 20 may support the substrate 16 during exposure by providing precise angular positioning and prevent unwanted movement during the exposure. In this regard, for example, the pedestal may comprise, for example, an electrostatic chuck. The pedestal 20 may also be supported by the chamber wall 18 and the chamber wall 18 may be supported by a static reference structure, for example, a facility floor with isolation dampers. In this way, when a relationship is established between the substrate 16 and the pedestal 20, then a relationship is also established between the substrate 16 and the chamber wall 18.

The chamber wall 18 may also include a substrate port 22 to enable the substrate 16 to enter and/or depart from the process volume 14. The chamber wall 18 may include dimensions larger than the substrate 16 to enable the movement of the substrate 16 and a positioning robot (not shown) to insert and remove the substrate 16 from a predetermined location at the pedestal 20 in the process volume 14. In this manner, the substrate 16 may enter and depart from the process volume 14.

The chamber wall 18 may include other features. The chamber wall 18 may also include a gas ring 24 including a plurality of gas ring nozzles 26 disposed around a perimeter of the chamber wall 18 to introduce a first portion of process gas into the process chamber 10. The chamber wall 18 may also include a ground shield (not shown) to prevent electrical coupling between the chamber wall 18, vacuum ports (not shown) to enable a low pressure or vacuum environment to be created in the process volume 14, and interfaces for electrical and/or mechanical operation of the pedestal 20. With at least these features, the chamber wall 18 may support the operation of the process chamber 10

Next, the lid assembly 28 of the process chamber 10 is used to cover an opening 30 (FIG. 1E) of the chamber walls 18 and protect against leakage of process gas or plasma therebetween by communicating with an interface surface 32 (FIG. 1E) of the chamber walls 18. In this regard, the lid assembly 28 includes a sealing surface 33 of a dome 34 which is configured to be supported by the interface surface 32 of the chamber wall 18. In this manner, the lid assembly 28 may contribute to isolate the process volume 14 from the ambient environment.

The lid assembly 28 is also configured to introduce a second portion of process gas and/or plasma into the process volume 14. In this regard, the lid assembly 28 contains at least one of: a process gas dispenser 36 and a first energy source 38. The process gas dispenser 36 may be disposed through the dome 34 in a predetermined position $A_m$, for example in a center of the process volume 14 and configured to deliver the process gas towards the substrate 16 positioned at the pedestal 20. The process gas dispenser 36 may be in communication to receive one or more process gases from a gas source 40. The process gas dispenser 36 facilitates the addition and/or removal of layers of the substrate 16 within the process volume 14 by emitting the process gases into the process volume 14 and toward the substrate 16 from a predetermined position above the substrate 16. The first energy source 38, for example, a radiofrequency (RF) coil may deliver radiofrequency radiation to the process gases in the process volume 14 to convert the process gas emitted by the process gas dispenser into plasma. In this manner, the process gas and/or the plasma may be delivered to the substrate 16 within the process volume of the 14 of the process chamber 10.

It is noted that the lid assembly 28 may also include a top stack 42 comprising thermal control components and a second energy source 43, for example other RF coils, to convert the process gas being delivered to the process volume 14 to plasma. An RF shield 44 may be secured to the dome 34 to provide isolation between the first energy source 38 and the second energy source 43 in the top stack 42.

Within continuing reference to FIGS. 1A through 1E the alignment system 12 is now described. The alignment system 12 includes at least one bracket 46A, 46B; at least one interface member 48A, 48B; and at least one actuator 50A, 50B. The brackets 46A, 46B provide a base for the actuators 50A, 50B to convey forces FA, FB between the actuators 50A, 50B and the chamber wall 18. Similarly, the interface members 48A, 48B provide a base for the actuators 50A, 50B to convey the force FA, FB between the actuators 50A, 50B and the lid assembly 28. Accordingly, removable fasteners 55 may be used to attach or secure the brackets 46A, 46B to the chamber wall 18 of the process chamber 10 and the interface members 48A, 48B with any component of the lid assembly 28 of the process chamber 10. The actuators 50A, 50B are configured to apply the force FA, FB between the brackets 46A, 46B and the interface members 48A, 48B. The actuators 50A, 50B may include, for example, threaded bolts 52A, 52B with control knobs 54A, 54B for precise control of the actuators 50A, 50B. The actuators 50A, 50B may be in communication, respectively, with first threaded holes 56A, 56B of the brackets 46A, 46B and second threaded holes 58A, 58B of the interface members 48A, 48B. In this manner, the actuators 50A, 50B may apply the force FA, FB to the chamber wall 18 and the lid assembly 28 through the brackets 46A, 46B and the interface members 48A, 48B. It is noted that the actuators 50A, 50B may be orientated orthogonal or substantially orthogonal to each other to direct the force along an X-direction and a Y-direction, respectively, to enable movement to be controlled independently in these directions.

FIG. 1E is a front sectional exploded view of the process chamber 10 and the alignment system 12. The forces FA, FB cause movement between the lid assembly 28 and the chamber wall 18. As discussed above, the dome 34 of the lid assembly 28 is supported by the interface surface 32 of the chamber wall 18. The weight of the lid assembly 28 upon the interface surface 32 provides frictional force to resist movement of the lid assembly 28 relative to the chamber wall 18. The forces FA, FB applied by the actuators 50A, 50B overcome this frictional force and enable the movement of the lid assembly 28 relative to the chamber wall 18. In this manner, the lid assembly 28 may be moved relative to the chamber wall 18. It is also noted that in some cases a lifting device (not shown), for example a gantry crane, may be used to reduce the weight of the lid assembly 28 upon the interface surface 32 to reduce the frictional force and the commensurate forces FA, FB needed to overcome the resulting frictional force.

Figure 2A:
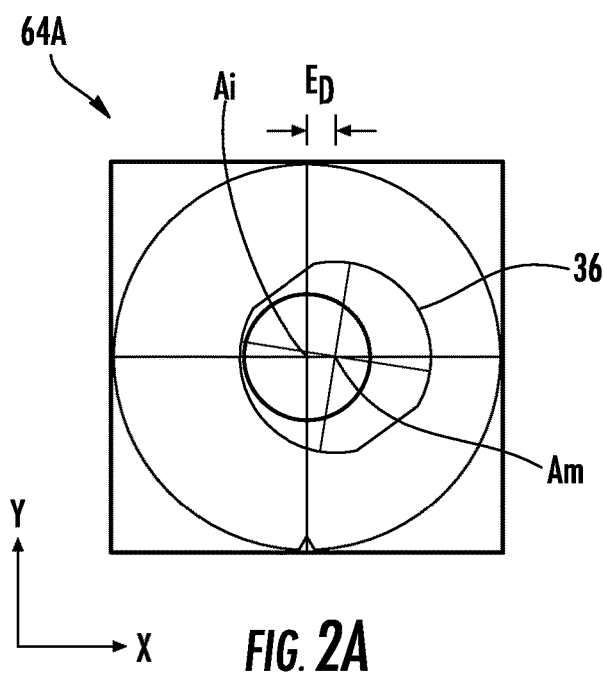
FIGS. 2A and 2B are representations of images at the computer monitor system of FIG. 1D, the images are taken with the camera wafer of FIG. 1D and the images depict, respectively, the lid assembly in alignment and out of alignment.
Figure 2B:
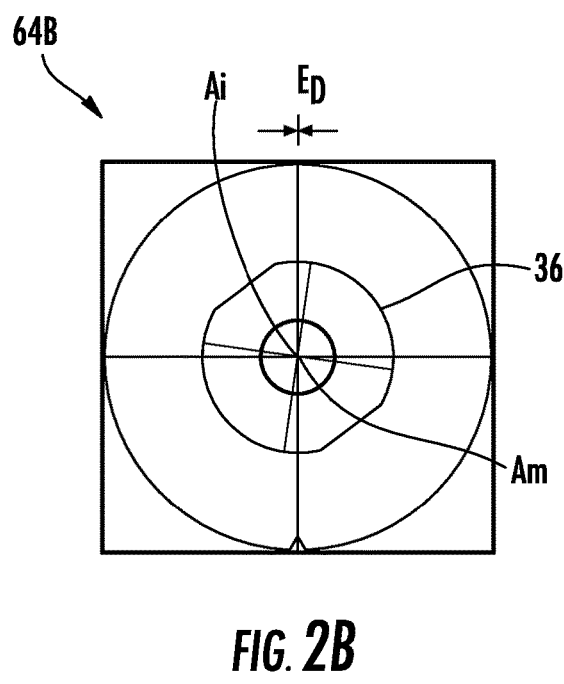

With reference back to FIG. 1D, the alignment system 12 also optionally employs a camera wafer 16A and a computer monitor 60 to determine a positional error $E_D$ of the lid assembly 28 relative to an optical axis Ai of the camera wafer 16A. The camera wafer 16A and the computer monitor 60 may be, for example, in wireless communication with each other. The camera wafer 16A is configured to be placed in a predetermined position at the pedestal 20 (for example by a robot) and provide images to the computer monitor 60 from a lens 62 of the camera wafer 16A of a reference feature within the process chamber 10 and relative to the optical axis Ai. FIGS. 2A and 2B are exemplary images 64A, 64B from the lens 62 of the camera wafer 16A of the process gas dispenser 36 of the lid assembly 28 before and after alignment with the actuators 50A, 50B. The actuators 50A, 50B may be continuously adjusted "realtime" while monitoring the images 64A, 64B until the positional error ED is zero or within acceptable tolerances within the images 64A, 64B. Values of the positional error ED which are at zero, or within acceptable tolerances, may be associated with desirable uniformity performance. When the optimal position of the lid assembly 28 relative to the substrate 16 is achieved, then the camera wafer 16A may be removed and then the substrate 16 may be disposed in the process volume 14 for exposure to the process as and/or plasma. In this manner, the camera wafer 16A in combination with the alignment system 12 may be used to position the lid assembly 28 relative to the chamber wall 18 to achieve improved uniformity performance.

It is also noted that the actuators 50A, 50B may further adjust the position of the lid assembly 28 relative to the substrate 16 by using feedback from measurements of the features processed on the substrate 16. In this further manner, the optimal position of the lid assembly 28 relative to the chamber wall 18 and the substrate 16 may be achieved.

FIGS. 3A through 3E are a top exploded view, a right view, a top view, a front view, and a rear view, respectively, of a subassembly of the alignment system 12 of FIG. 1A. The alignment system 12 is depicted as including the bracket 46A, 46B, the interface member 48A, 48B, the actuator 50A, 50B, and fasteners 55. The bracket 46A, 46B and the interface member 48A, 48B may include first threaded holes 56A, 56B and second threaded holes 58A, 58B, respectively, to communicate with the actuator 50A, 50B. It is noted that the interface members 48A, 48B may include first and second portions 68, 70 connected by fasteners 55 for easier assembly in situations where an integral form of the interface members 48A, 48B would be less convenient to install to the lid assembly 28. The integral version of the interface member 48A, 48B is also acceptable for use in other examples of the alignment system 12. In this manner, the alignment system 12 may be formed to move the lid assembly 28 relative to the chamber wall 18.

It is also noted that secondary interface members 66A, 66B may optionally also be attached at different locations of the lid assembly 28 as part of the alignment system 12 to provide support to the lid assembly 28 during movement. The secondary interface members 66A, 66B may be similar to the interface members 48A, 48B and will not be discussed further for conciseness and clarity.

Now that the process chamber 10 and the alignment system 12 have been introduced, an exemplary method 100 for aligning the lid assembly 28 to the substrate 16 is now disclosed. The method 100 will be discussed using the terminology developed above and operations 100a through 100f depicted in the flowchart provided in FIG. 4.

Figure 4:
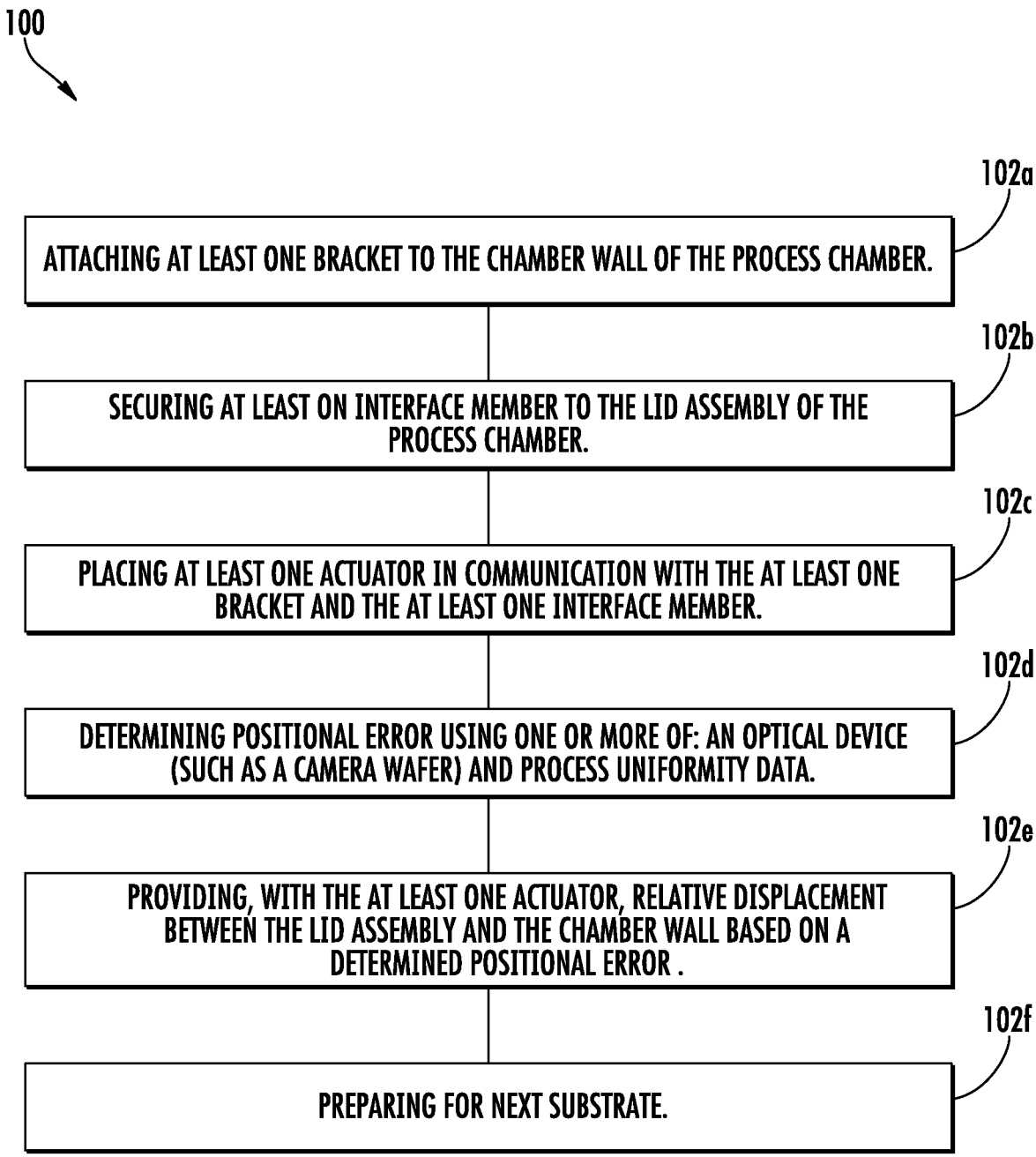
FIG. 4 is a flowchart of an exemplary process of aligning the process chamber of FIG. 1A using the alignment system of FIG. 1A.

In this regard, the method 100 includes attaching at least one bracket 46A, 46B to the chamber wall 18 of the process chamber 10 (operation 102a of FIG. 4). The method 100 includes securing the at least one interface member 48A, 48B to the lid assembly 28 of the process chamber 10 (operation 102b of FIG. 4). The method 100 includes placing at least one actuator 50A, 50B in communication with the at least one bracket 46A, 46B and the at least one interface member 48A, 48B (operation 102c of FIG. 4). In this manner, the relative movement between the lid assembly 28 and the chamber wall 18 may be facilitated.

The method 100 includes determining positional error using one or more of: an optical device, such as a camera wafer 16A or laser alignment system, and downstream process uniformity data measured from the substrate 16 (operation 102d of FIG. 4). The method 100 includes providing, with the at least one actuator 50A, 50B, relative displacement between the lid assembly 28 and the chamber wall 18 based on a determined positional error associated with lithographic uniformity performance (operation 102e of FIG. 4). The method 100 includes preparing the process chamber 10 for the next substrate 16 (operation 102f of FIG. 4).

It is recognized there other embodiments of the process chamber 10 and the alignment system 12. In this regard, FIGS. 5A and 5D are a top view and a top perspective view, respectively, of another embodiment of an exemplary process chamber 10' and another embodiment of an exemplary alignment system 12', including a y-direction actuator 50B and an x-direction actuator 50A. FIGS. 5B and 5C are close-up top views, respectively, of the y-direction actuator and the x-direction actuator of the alignment system 12' of FIG. 5A.

The alignment system 12' and the process chamber 10' of FIG. 5A are similar to the alignment system 12 and the process chamber 10 of FIG. 1A and mostly the differences will be discussed in the interests of clarity and conciseness. The interface members 48A, 48B are secured to both the top stack 42 and a lid plate 35 of the process chamber 10'. The lid plate 35 and/or the dome 34 may be supported by the interface surface 32 of the chamber wall 18'. In this manner, the alignment system 12' may be used to provide relative displacement between the lid assembly 28 and the substrate 16 within the chamber wall 18' to optimize lithographic uniformity performance.

To facilitate understanding, identical reference numerals have been used, where possible, to designate identical elements that are common to the figures. It is contemplated that elements and features of one embodiment may be beneficially incorporated in other embodiments without further recitation.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A method of aligning a lid assembly of a process chamber and processing a substrate therein, comprising:
   sealing an opening of the process chamber with the lid assembly;
   moving a reference location on the lid assembly relative to a chamber wall of the process chamber in a first direction from a first position in a horizontal plane to a second position in the horizontal plane, the opening of the process chamber remaining sealed during the moving of the reference location on the lid assembly from the first position to the second position;
   moving the reference location on the lid assembly relative to the chamber wall of the process chamber in a second direction from the second position in the horizontal plane to a third position in the horizontal plane, the opening of the process chamber remaining sealed by the lid assembly during the moving of the reference location on the lid assembly from the second position to the third position; and processing a substrate inside the process chamber after moving the reference location on the lid assembly from the second position to the third position, wherein the opening of the process chamber remains sealed by the lid assembly from before the moving of the reference location on the lid assembly from the second position to the third position until after the substrate is processed inside the process chamber.

2. The method of claim 1, wherein the first direction is substantially orthogonal to the second direction.

3. The method of claim 1, wherein moving the reference location on the lid assembly from the first position to the second position is performed in response to measurements determined from one or more images captured by a camera wafer positioned inside the process chamber.

4. The method of claim 1, wherein moving the reference location on the lid assembly from the first position to the second position is performed in response to measuring one or more features on a substrate positioned inside the process chamber.

5. The method of claim 1, wherein moving the reference location on the lid assembly from the first position to the second position is performed when a substrate is positioned inside the process chamber.

6. The method of claim 1, wherein the lid assembly comprises an energy source configured to generate a plasma inside the process chamber and a gas dispenser.

7. A method of aligning a lid assembly of a process chamber and processing a substrate therein, comprising:
sealing an opening of the process chamber with the lid assembly;
moving a reference location on the lid assembly relative to a chamber wall of the process chamber in a first direction from a first position in a first plane to a second position in the first plane, the opening of the process chamber remaining sealed during the moving of the reference location on the lid assembly from the first position to the second position;
moving the reference location on the lid assembly relative to the chamber wall of the process chamber in the first direction from the second position in the first plane to a third position in the first plane, the opening of the process chamber remaining sealed by the lid assembly during the moving of the reference location on the lid assembly from the second position to the third position and the first plane is located a first distance from a substrate support disposed in the process chamber; and
processing a substrate inside the process chamber after moving the reference location on the lid assembly from the second position to the third position, wherein the opening of the process chamber remains sealed by the lid assembly from before the moving of the reference location on the lid assembly from the second position to the third position until after the substrate is processed inside the process chamber.

8. The method of claim 7, wherein moving the reference location on the lid assembly from the first position to the second position is performed in response to measurements determined from one or more images captured by a camera wafer positioned inside the process chamber.

9. The method of claim 7, wherein moving the reference location on the lid assembly from the first position to the second position is performed in response to measuring one or more features on a substrate positioned inside the process chamber.

10. The method of claim 7, wherein moving the reference location on the lid assembly from the first position to the second position is performed when a substrate is positioned inside the process chamber.

11. The method of claim 7, wherein the lid assembly comprises an energy source configured to generate a plasma inside the process chamber and a gas dispenser.

12. A method of aligning a lid assembly of a process chamber and processing a substrate therein, comprising:
sealing an opening of the process chamber with the lid assembly, wherein the process chamber comprises a substrate support configured to support a substrate in a first horizontal plane;
moving a reference location on the lid assembly relative to a chamber wall of the process chamber in a first direction from a first position in a second horizontal plane to a second position in the second horizontal plane in response to one or more measurements taken from inside the process chamber, wherein the opening of the process chamber remains sealed by the lid assembly during the moving of the reference location on the lid assembly from the first position to the second position; and
processing a substrate inside the process chamber after moving the reference location on the lid assembly from the first position to the second position, wherein the opening of the process chamber remains sealed by the lid assembly from before the moving of the reference location on the lid assembly from the first position to the second position until after the substrate is processed inside the process chamber.

13. The method of claim 12, wherein the one or more measurements comprise one more measurements determined from one or more images captured by a camera wafer positioned inside the process chamber.

14. The method of claim 13, wherein the one or measurements determined from the one or more images comprises a positional error of the lid assembly relative to an optical axis of the camera wafer.

15. The method of claim 12, wherein the one or more measurements comprise one more measurements of one or more features on a substrate positioned inside the process chamber.

16. The method of claim 12, further comprising continuously monitoring the one or more measurements from inside the process chamber during a process performed on a substrate inside the process chamber and continuously using the one or more measurements to control a position of the reference location on the lid assembly relative to the chamber wall.

17. The method of claim 12, wherein moving the reference location on the lid assembly from the first position to the second position is performed when a substrate is positioned inside the process chamber.

18. The method of claim 12, wherein the lid assembly comprises an energy source configured to generate a plasma inside the process chamber and a gas dispenser.

* * * * *